US010501867B2

(12) United States Patent
Ayon et al.

(10) Patent No.: US 10,501,867 B2
(45) Date of Patent: Dec. 10, 2019

(54) SELF-ALIGNED TUNABLE METAMATERIALS

(71) Applicants: Arturo A Ayon, San Anotnio, TX (US); Ramakrishna Kotha, Austin, TX (US); Diana Strickland, San Antonio, TX (US)

(72) Inventors: Arturo A Ayon, San Anotnio, TX (US); Ramakrishna Kotha, Austin, TX (US); Diana Strickland, San Antonio, TX (US)

( * ) Notice: Subject to any disclaimer, the term of this patent is extended or adjusted under 35 U.S.C. 154(b) by 404 days.

(21) Appl. No.: 15/070,991

(22) Filed: Mar. 15, 2016

(65) Prior Publication Data

US 2016/0194786 A1 Jul. 7, 2016

Related U.S. Application Data

(62) Division of application No. 14/380,987, filed as application No. PCT/US2013/030268 on Mar. 11, 2013, now abandoned.

(Continued)

(51) Int. Cl.
*C30B 29/10* (2006.01)
*H01Q 1/24* (2006.01)
(Continued)

(52) U.S. Cl.
CPC ............ *C30B 29/10* (2013.01); *B32B 15/017* (2013.01); *B32B 15/018* (2013.01); *C30B 19/06* (2013.01);
(Continued)

(58) Field of Classification Search
CPC ......... C30B 29/10; C30B 29/06; C30B 33/12; C30B 33/10; C30B 29/607; C30B 29/58; C30B 29/52; C30B 23/08; C30B 30/02; C30B 23/02; C30B 19/12; C30B 29/68; C30B 23/025; C30B 29/66; C30B 19/06; C30B 19/103; B32B 15/017; B32B 15/018; H01Q 15/0086; H01Q 3/01; H01Q 1/24;
(Continued)

(56) References Cited

U.S. PATENT DOCUMENTS 6,898,362 B2 * 5/2005 Forbes ................... B82Y 20/00
385/122
6,929,984 B2 * 8/2005 Forbes ................ H01L 21/3223
257/E21.319

(Continued)

OTHER PUBLICATIONS

Galisteo, J.F. et al "Self-assembly approach to optical metamaterials" Journal of Optics A: Pure and Applied Optics, vol. 7, No. 2, S244-S254, Jan. 20, 2005. (Year: 2005).*

(Continued)

*Primary Examiner* — Anita K Alanko
(74) *Attorney, Agent, or Firm* — Jackson Walker LLP

(57) ABSTRACT

A self-aligned tunable metamaterial is formed as a wire mesh. Self-aligned channel grids are formed in layers in a silicon substrate using deep trench formation and a high-temperature anneal. Vertical wells at the channels may also be etched. This may result in a three-dimensional mesh grid of metal and other material. In another embodiment, metallic beads are deposited at each intersection of the mesh grid, the grid is encased in a rigid medium, and the mesh grid is removed to form an artificial nanocrystal.

21 Claims, 5 Drawing Sheets

Related U.S. Application Data

(60) Provisional application No. 61/609,109, filed on Mar. 9, 2012.

(51) Int. Cl.

| | | |
|---|---|---|
| H01Q 3/01 | (2006.01) | |
| H01P 11/00 | (2006.01) | |
| H01Q 15/00 | (2006.01) | |
| C30B 19/06 | (2006.01) | |
| C30B 19/10 | (2006.01) | |
| C30B 19/12 | (2006.01) | |
| C30B 23/02 | (2006.01) | |
| C30B 23/08 | (2006.01) | |
| C30B 29/52 | (2006.01) | |
| C30B 29/58 | (2006.01) | |
| C30B 29/66 | (2006.01) | |
| C30B 29/68 | (2006.01) | |
| C30B 30/02 | (2006.01) | |
| C30B 29/60 | (2006.01) | |
| B32B 15/01 | (2006.01) | |
| C30B 29/06 | (2006.01) | |
| C30B 33/10 | (2006.01) | |
| C30B 33/12 | (2006.01) | |
| B82Y 20/00 | (2011.01) | |
| H01L 21/308 | (2006.01) | |
| B82Y 40/00 | (2011.01) | |
| C23F 1/02 | (2006.01) | |
| H01L 21/3065 | (2006.01) | |
| C23F 1/20 | (2006.01) | |
| C23F 1/44 | (2006.01) | |
| C09K 13/00 | (2006.01) | |

(52) U.S. Cl.
CPC ............ *C30B 19/103* (2013.01); *C30B 19/12* (2013.01); *C30B 23/02* (2013.01); *C30B 23/025* (2013.01); *C30B 23/08* (2013.01); *C30B 29/06* (2013.01); *C30B 29/52* (2013.01); *C30B 29/58* (2013.01); *C30B 29/607* (2013.01); *C30B 29/66* (2013.01); *C30B 29/68* (2013.01); *C30B 30/02* (2013.01); *C30B 33/10* (2013.01); *C30B 33/12* (2013.01); *H01P 11/00* (2013.01); *H01Q 1/24* (2013.01); *H01Q 3/01* (2013.01); *H01Q 15/0086* (2013.01); *B82Y 20/00* (2013.01); *B82Y 40/00* (2013.01); *C09K 13/00* (2013.01); *C23F 1/02* (2013.01); *C23F 1/20* (2013.01); *C23F 1/44* (2013.01); *H01L 21/3065* (2013.01); *H01L 21/3083* (2013.01); *Y10T 428/12361* (2015.01); *Y10T 428/24322* (2015.01)

(58) Field of Classification Search
CPC ...... H01P 11/00; C09K 13/00; H01L 21/3083; H01L 21/3065; B82Y 40/00; B82Y 20/00; C23F 1/02; C23F 1/44; C23F 1/20; Y10T 428/12361; Y10T 428/24322
See application file for complete search history.

(56) References Cited

U.S. PATENT DOCUMENTS

| | | | | |
|---|---|---|---|---|
| 7,964,124 | B2* | 6/2011 | Geusic | B29C 59/005 264/154 |
| 2002/0175330 | A1* | 11/2002 | Geusic | B82Y 20/00 257/74 |
| 2004/0134879 | A1* | 7/2004 | Kochergin | B82Y 20/00 216/24 |
| 2005/0191774 | A1* | 9/2005 | Li | B82Y 10/00 438/22 |
| 2005/0266246 | A1* | 12/2005 | Reiss | C09K 11/02 428/403 |
| 2008/0165079 | A1* | 7/2008 | Smith | B82Y 20/00 343/911 R |
| 2008/0213542 | A1* | 9/2008 | Huo | B23K 26/16 428/172 |
| 2010/0078203 | A1* | 4/2010 | Lier | H01Q 13/02 174/258 |
| 2010/0248449 | A1* | 9/2010 | Hildreth | B81C 1/00071 438/460 |
| 2012/0097204 | A1* | 4/2012 | Yu | B82Y 30/00 136/200 |

OTHER PUBLICATIONS

Prasad, B.L.V. et al "Digestive Ripening of Thiolated Gold Nanoparticles: The Effect of Alkyl Chain Length" Langmuir, 18, 7515-7520, Aug. 29, 2002. (Year: 2002).*

* cited by examiner

SELF-ALIGNED TUNABLE METAMATERIALS

RELATED APPLICATIONS

This application is a divisional of U.S. patent application Ser. No. 14/380,987, filed on Aug. 26, 2014, which is a national-stage entry of PCT/US2013/030268, filed on Mar. 11, 2013, which claims priority to U.S. Patent Application No. 61/609,109, filed on Mar. 9, 2012. The prior application is herein incorporated by reference in its entirety.

BACKGROUND

Field of the Disclosure

This disclosure relates to the field of tunable metamaterials, and more particularly to self-aligned arrays of nanomaterials.

Description of the Related Art

Metamaterials are synthetic, composite materials with periodic structures, known for their ability to create electromagnetic or acoustic properties that are not found in nature and that may determine how the material interacts with various types of radiation. Metamaterials may direct radiation either due to the external shape of a metamaterial structure or by spatially indexing the metamaterial. Conventional methods of forming metamaterial periodic and spatially indexed arrays in the nanoscale range, such as ion beam methods, are limited by processing options, materials, and ultimately, economic feasibility, and may be poorly suited to gain widespread industrial applicability. Therefore, there is a need in the art for an industrial method of producing desired tunable nanowire arrays in sufficient quantities and at relatively low cost.

DESCRIPTION OF THE EMBODIMENT(S)

Figure 1:
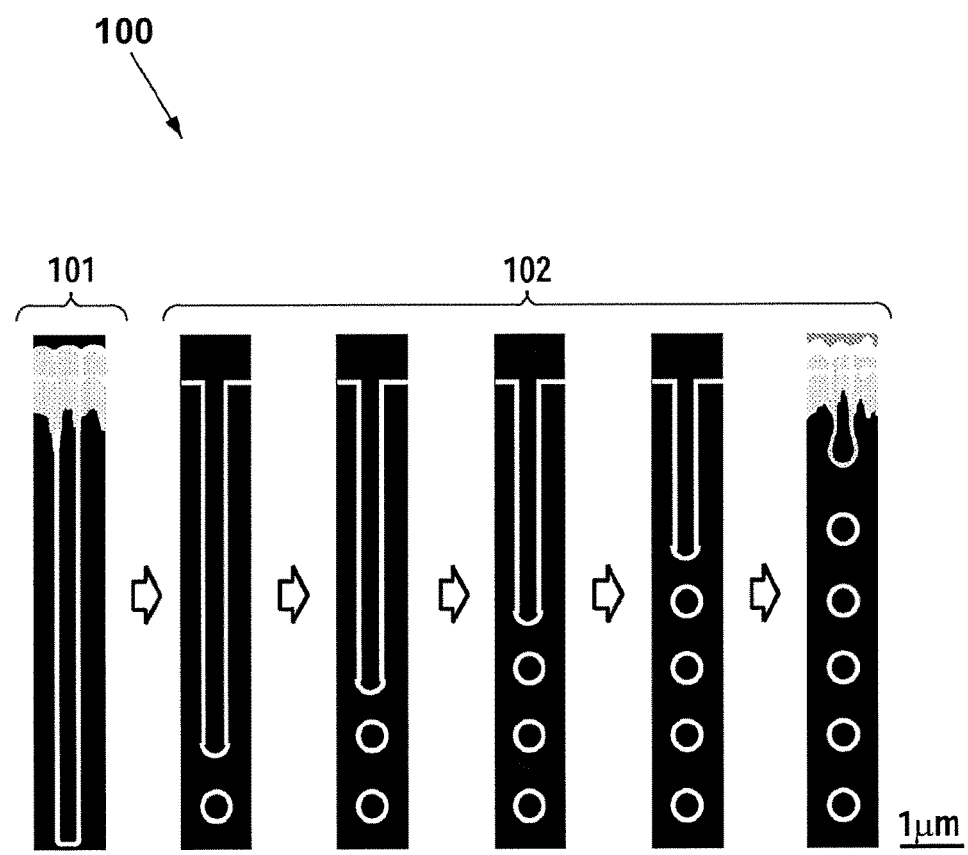
FIG. 1 is a prior art representation of an empty-space-in-silicon process.

Various types of metamaterials are known that possess bulk electromagnetic properties different from materials observed in nature. These properties may create specific dispersion characteristics within the metamaterial, or they may control the way the metamaterial reflects, refracts, absorbs, scatters or transmits radiation.

Metamaterials are also known that direct electromagnetic radiation. The ability to direct radiation can result from an outer form or shape of a given material, for example, as in a conventional lens. Another way to control the path of radiation can result from the internal structure of a material. Spatial indexing, as used herein, refers to a patterned structure of a material that enables tuning of the electromagnetic properties of the material in space. For example, the geometry of an array structure and/or the constituent material composition may be varied in space. In one embodiment, a smooth increase of an array periodicity in a given direction may result in a gradual alteration of a metamaterial's permittivity in the given direction. Such spatially indexed properties of a metamaterial may be realized in 2-D and/or 3-D and may encompass tailoring the metamaterial for different kinds of properties and/or combinations of properties varying in space, as desired. One example of a spatially indexed metamaterial may exhibit a smooth increase in array periodicity in a single given direction. In other examples, the smooth increase in array periodicity may be present in two or three directions.

Control of bulk properties may be accomplished by positioning particles in periodic or non-periodic arrays with dimensions much smaller than an operational wavelength of electromagnetic radiation. The shape, placement and/or orientation of the particles, as well as constituent materials of the particles and/or a host material in which the particles reside, may determine the bulk properties of the array structure. The bulk properties may be tuned for a desired interaction in a particular range of wavelengths (or frequencies) of electromagnetic radiation. For example, for long wave infrared frequencies and higher, the array structure may be formed in nanoscale dimensions. Below infrared frequencies, the array structure may also be of nanoscale dimensions. The array structures may be formed as grids, meshes, or crystal-like lattices in nanoscale dimensions that may be 2-D and/or 3-D in scope.

The novel and non-obvious fabrication processes, as described in further detail herein, provide various means for forming the array structure, as well as placing particles composed of desired constituent materials at desired locations in the array structure. Various dimensions, features, and compositions may be employed for tuning the array structure to interact with radiation of a desired frequency and/or frequency range(s). The control of bulk properties realized using the methods described herein may enable applications such as absorbers, waveguides, sensors, reflectors, phase control devices, radiation concentrators, cloaking devices, imaging devices, and electromagnetic pulse protectors, among others.

One example structure for realizing a spatially indexed metamaterial is an array structure, such as a grid, mesh, or lattice, that may be implemented as a 3-D framework. Such an array structure may be realized in one embodiment using nanowires to form the framework. The tunability of such a 3-D nanowire array may be achieved by modulating dimensional properties, such as wire thickness, array spacing, etc., as well as through selection of the material(s) for the nanowire array. Voids and/or empty space may also be used to tune the properties of the metamaterial, as will be discussed in further detail below.

While conventional semiconductor processing methods may be useful to produce array structures on a 2-D surface of a flat substrate, such methods may be excessively costly and laborious in the nanoscale range. Furthermore, many conventional processing methods do not generally scale up to a 3-D approach. Thus, producing 2-D and/or 3-D nanoscale array structures with specific tunable properties using conventional methods, for example by forming layer upon layer in a successive manner, may not be economically feasible and may be unsuitable for widespread industrial exploitation. As will be described herein, a novel and patentably distinct method for forming 2-D and 3-D nanoscaled arrays is disclosed that relies on self-alignment through inherent thermodynamic properties of a silicon substrate.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, for example, widget 12-1 refers to an instance of a widget class, which may be referred to collectively as widgets 12 and any one of which may be referred to generically as a widget 12.

Turning now to the figures, FIG. 1, is a prior art representation of empty-space-in-silicon process 100, sometimes also known as silicon-on-nothing [see T. Sato, et al., Electrochem. Soc. Proc. 539, 2000-17 (2000)]. The process 100 is an example of a method of producing self-aligned structures in a silicon substrate. In operation 101, deep reactive etching (also known as DRIE) is performed on an etched single crystal silicon substrate to produce a deep channel of desired dimensions (i.e., width and depth). In operation 102, several intermediate states of a single annealing step are shown that may result in self-organization (i.e., self-alignment) of empty bubbles in the bulk silicon that become buried upon healing of the top silicon surface. The annealing may be performed under hydrogen at relatively high temperatures (e.g., at about 1100° C.) and at ambient pressures of about 10 Torr. Such processing conditions promote silicon migration and formation of voids or channels, depending upon the etch geometry.

Figure 2A:
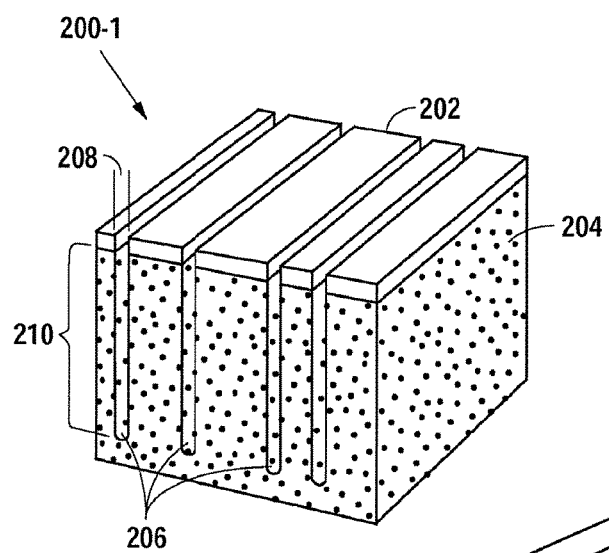
FIG. 2A is a block diagram of selected elements of an embodiment of a structure for forming a self-aligned metamaterial.

Referring now to FIG. 2A, a block diagram of selected elements of an embodiment of structure 200-1 for forming a self-aligned metamaterial is shown. Structure 200-1 is shown as a cut-away view and may be representative for structures of various dimensions and/or may represent a repeating element in a larger super-structure (not shown). Structure 200-1 shows a pattern formed in photoresist 202 at the surface of a crystalline silicon substrate 204 that has been etched to produce deep channels 206 of a desired geometry. The dimensions of the geometry, including width 208 and depth 210 may be determined at this step for tuning final dimensions of a 3-D nanowire array, as will be subsequently demonstrated. For example, width 208 may be determined by patterning photoresist 202 accordingly, while depth 210 may be determined by process etch parameters. A number of deep channels 206 as well as spacing between deep channels 206 may also be determined by patterning photoresist 202. In this manner, tuning of a 3-D nanowire array may be performed using 2-D patterning and etching techniques.

Figure 2B:
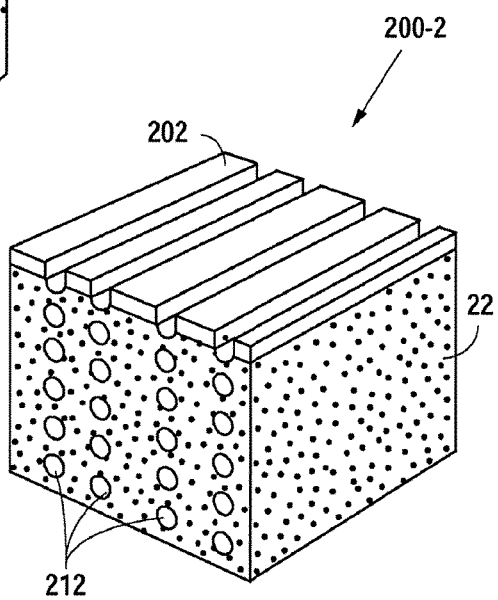
FIG. 2B is a block diagram of selected elements of an embodiment of a structure for forming a self-aligned metamaterial.

FIG. 2B is a block diagram of a prior-art embodiment of structure 200-2 for forming a self-aligned metamaterial. Structure 200-2 is similar to structure 200-1 (see FIG. 2A) but is shown after an annealing step that has transformed deep channels 206 into channel grids 216, which are self-aligned along the original mask pattern in photoresist 202. The annealing step may be varied to control a number and arrangement of linear channels 212, in various embodiments. It is noted that in certain embodiments, linear channels 212 may be formed in a single horizontal layer (not shown) buried beneath a surface of structure 200-2, which may result in a 2-D array structure (not shown). It is further noted that the dimensions of linear channels 212 also correspond to those of deep channels 206 and of the mask pattern, accordingly. In some embodiments, crystalline silicon substrate 22 itself may be used as a metamaterial with anisotropic bulk permittivity that may have a value of one (1) or a low value. In various embodiments, crystalline silicon substrate 22 may exhibit a spatially indexed permittivity that may vary in a regular or irregular manner in space.

Figure 2C:
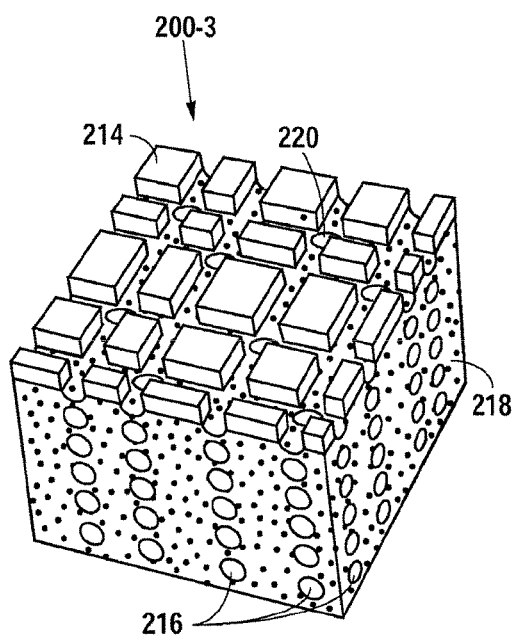
FIG. 2C is a block diagram of selected elements of an embodiment of a structure for forming a self-aligned metamaterial.

FIG. 2C is a block diagram of selected elements of an embodiment of structure 200-3 for forming a self-aligned metamaterial is shown. Structure 200-3 is similar to structure 200-2 (see FIG. 2B) but is shown with an orthogonal pattern of channels forming a grid pattern in photoresist 214, which has resulted in a stack of channel grids 216. In certain embodiments, substrate 218 having channel grids 216 may serve as a metamaterial with desired bulk properties and/or as a spatially indexed metamaterial.

Also formed in structure 200-3 are vertical wells 220, which may also be formed using a patterning/etch technique or another method to remove material at a particular location. Vertical wells 220 may penetrate substrate 218 vertically to a desired depth (obscured from view in structure 200-3) to intersect one or more channel grids 216. Vertical channels (not shown) may also be formed that do not intersect channel grids 216. Either with or without intersections, substrate 218 may be used in various embodiments to form metamaterials with isotropic and/or anisotropic bulk permittivity at may have a value of one (1) or a low value. In different embodiments, substrate 218 may exhibit a spatially indexed permittivity that may vary in a regular or irregular manner in space. As shown in FIG. 2C, vertical wells 220 are open at a top surface of substrate 218, which may extend empty space within channel grids 216 in 3-D. In certain embodiments, vertical wells 220 may provide a route for subsequent deposition steps that fill the array. In other embodiments, vertical wells are formed in a subsequent processing step after channel grids 216 have been formed and/or filled with another material, as will be described below in more in detail. In yet other embodiments, vertical wells 220 may be etched at angles other than normal to channel grids 216, for example by rotating substrate block 218. This process may be used, for example, to create a Bragg diffraction grating.

After channel grids 216 and/or vertical wells 220 have been formed, substrate 218 may be sectioned vertically to reveal ends of channel grids 216, exposing an inner surface of channel grids 216 to an external atmosphere. In this state, structure 200-3 may be subject to a deposition process (e.g., metallic vaporization, evaporation, sputtering, electroless deposition, and/or electroplating) to form a solid structure within channel grids 216 and/or vertical wells 220. Different materials may be deposited within channel grids 216 from those deposited within vertical wells 220 to form a nanoscale composite material. In certain embodiments, a partial deposition may result in a tubular (i.e., hollow) lattice structure being deposited within channel grids 216 and/or vertical wells 220. In one embodiment, a relatively thin deposited metal layer creates a material with permittivity tailored in three dimensions that is substantially zero or near zero (also referred to as epsilon near zero or ENZ). In other instances, a full deposition may result in a solid structure being formed in an interior volume defined within channel grids 216 and/or vertical wells 220.

Mask 202 is depicted in structure 200 with lines removed for etching linear trenches. In other embodiments (not shown), the mask pattern and subsequent trenches may be curved. One specific embodiment may include curved patterns to form broken or split rings that allow magnetic and/or magnetoelectric structures to be formed. Arrays of these structures formed as planes of broken toroidal voids and subsequently metallized may represent omega structures (e.g., omega-particle metamaterials), which may display negative permittivity and/or magnetoelectric properties. In combination with metallized vertical channels, such omega structures may exhibit negative index of refraction. Other magnetic structures, such as so-called Swiss rolls and/or oriented helix arrays resulting from tapered walls on deep channels 206 may also be formed in various embodiments. Such magnetic and/or magnetoelectric structures may be used to tune the permeability or magnetoelectric bulk or spatially indexed parameters of the metamaterial.

Figure 3:
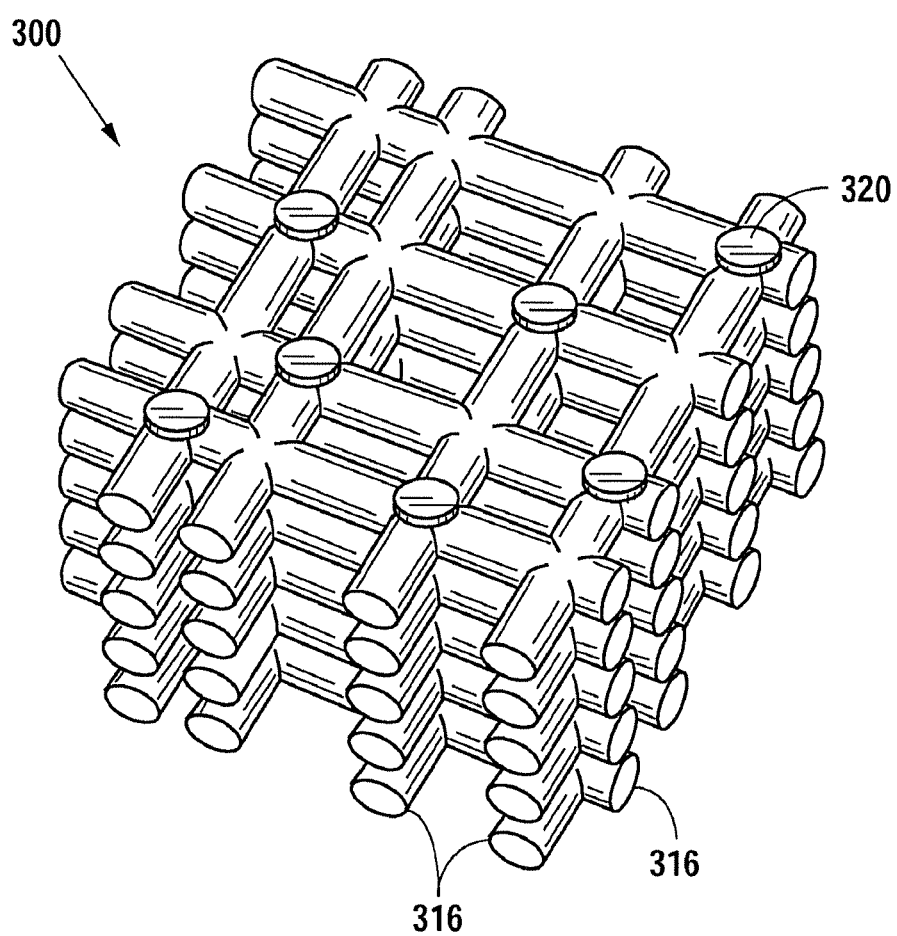
FIG. 3 is a block diagram of selected elements of an embodiment of a self-aligned metamaterial.

Turning now to FIG. 3, a block diagram of selected elements of an embodiment of self-aligned metamaterial 300 is shown. The bulk or spatially indexed properties of self-aligned metamaterial 300 may be achieved by virtue of the dimensions and arrangement of an array structure. In certain embodiments, self-aligned metamaterial 300 is a nanowire array formed by depositing a desired material, as described previously, within channel grids 216 and/or vertical wells 220 (see FIG. 2C). Accordingly, vertical elements 320 may correspond to vertical wells 220, while horizontal elements 316 may correspond to channel grids 216. Prior to metallization, various process steps may be undertaken, such as additional etching and/or surface treatments. After metallization, the silicon substrate matrix may be etched away or otherwise removed to result in self-aligned metamaterial 300 as shown in FIG. 3. In certain embodiments, a subsequent deposition step may be performed to add a matrix, a surface layer, and/or a desired coating to the structure depicted in FIG. 3. For example, a ferroelectric coating may provide dynamic tunability to self-aligned metamaterial 300.

Vertical elements 320 may be formed from the same material as horizontal elements 316 and may be selected to provide structural support and rigidity to self-aligned metamaterial 300. In given embodiments (not shown), vertical elements 320 may be formed at every intersection of horizontal elements 316. Since vertical elements 320 may be formed by different processing operations than horizontal elements 316, it is noted that vertical elements 320 may also be formed from a different material than horizontal elements 316 for a variety of purposes and applications. For example, vertical elements 320 may be formed as beads or connectors that are insulators (such as SU8) or semiconductors, for example when horizontal elements 316 are conductors and may result in a semiconductor device formed within self-aligned metamaterial 300. Vertical elements 320 may be flexible to provide desired elasticity or resonance, for example, when horizontal elements 316 are relatively stiff. Vertical elements 320 may also be made of metals, dielectrics, bi-metallics, ferroelectrics, and/or ferromagnetics in order to alter bulk properties. In particular embodiments, vertical elements 320 are formed to achieve deformable, reconfigurable, and/or dynamically controllable mobile structures. In other embodiments, active and/or dynamic materials may be formed as 2-D or 3-D arrays of antennas driven through vertical elements 320 that are metallized. Individual elements in such arrays may be individually driven (or driven in groups) to create shaped radiation transmission/reception patterns, or may be phased to create steerable radiation beams. In other embodiments, horizontal elements 316 may be formed at least in part as ferroelectric dots that provide controllable features. For example, the ferroelectric dots may be individually voltage biased (or biased in groups) to form arrays that are dynamically tunable and may be spatially indexed along one or more directions or axes. In certain embodiments, horizontal elements 316 may be formed at least in part as magnetic dots and may form a material with permanent magnetization that is also tunable in one or more directions. When vertical elements 220 are etched at certain angles with respect to a substrate surface and subsequently metallized, a material with a very high index of refraction and special dispersion properties may be formed. Self-aligned metamaterial 300 may allow for economical and industrial scale production of a wide variety of novel 3-D array structures that have previously been inaccessible.

Figure 4:
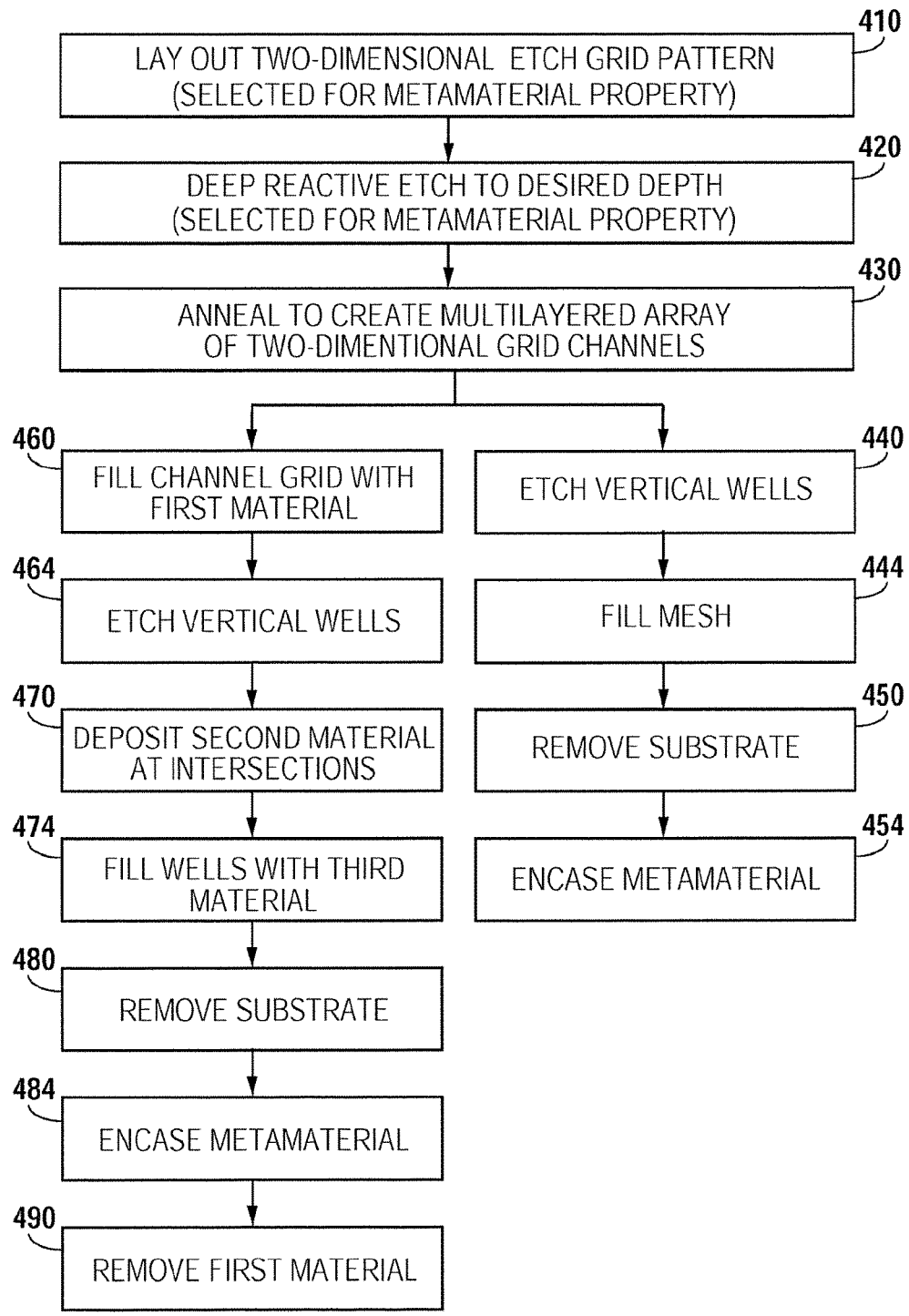
FIG. 4 is a flow chart of an exemplary method of producing a self-aligned metamaterial.

FIG. 4 is a flow chart of an exemplary method of manufacturing a metamaterial according to the disclosure of the present disclosure. Elements depicted in method FIG. 4 may be omitted or rearranged, as desired in different embodiments. FIG. 4 provides an illustrative and non-limiting example of formation of self-aligned metamaterials, as previously discussed herein.

Manufacturing begins with a masked substrate block 200, with mask 202. In step 410, a two-dimensional grid pattern is laid out on the mask. The grid pattern, including the length, width, and intersections of trace liens, is selected for a desired metamaterial property, such as a specific desired permittivity or resonant frequency. In some embodiments, the grid pattern is selected to be periodic. Further in some embodiments, the grid pattern may be a substantially rectilinear grid, as shown in FIG. 2C. In other embodiments, curved or other non-rectilinear grid patterns may be used, including wavy lines, circles, magnetic field lines, spirals, or randomized lines. In some embodiments, non-rectilinear patterns may be used to create artificial magnets.

The patter of step 410 may involve various geometries and designs, and is not limited to the linear examples presented herein for descriptive clarity (see FIGS. 2A-C, 3). Various types of patterning and etch processes may be employed to create deep channels in the silicon substrate. The pattern features and dimensions may be selected for a desired configuration of the self-aligned metamaterial, as mentioned previously.

Once the two-dimensional grid pattern is laid out, in step 420 block 200 is etched using for example deep reactive etching. The etching depth is selected for a desired metamaterial property, and in particular may be selected to provide a desired number of grid layers. In an exemplary embodiment, deep reactive etching is carried out to a uniform depth throughout the two-dimensional grid pattern. However, those having skill in the art will recognize that in some embodiments, the etching depth can be selectively varied to create non-uniform channel depths, which may control desired properties of a metamaterial.

In step 430, substrate block 200 is annealed to create a plurality of layered channel grids, each layer following the pattern of the two-dimensional grid pattern. The annealing process is known in the prior art, and may involve hydrogen annealing at relatively high temperature. Annealing creates bubbles that "heal" in layers into the desired pattern. Each channel grid thus formed is analogous to a two-dimensional network of tunnels, and each occupies a single vertical position in the substrate block. In an exemplary embodiment, each channel grid is substantially identical to each other channel grid because the deep reactive etch of step 420 is performed to a uniform depth throughout the block. The channel grids collectively are all vertically self-aligned with one another. At step 430, the channel grids are not interconnected with each other, but rather lie in a parallel stack of several layers. Those with skill in the art will recognize that substances other than silicon may be used as a substrate, in which case, another type of anneal or thermodynamically self-aligned void array formation process may be used.

Etching step 440 is a common to a plurality of variations of the method disclosed herein. However, in some embodiments, intervening step 460 may be performed. In general, the method that follows the step-440 branch, wherein etching step 440 immediately follows annealing step 430 is suitable for embodiments wherein the target metamaterial is a mesh structure. The step-460 branch, wherein annealing step 430 is followed by a filling step 460 is suitable for embodiments wherein the target metamaterial is an artificial nanocrystal, or wherein vertical well portions of the metamaterial are to be constructed of material different from the material of the two-dimensional grid. Those having skill in the art will appreciate that many combinations of the basic steps disclosed are possible.

Following the step-440 branch, at step 440, vertical wells 220 are etched substantially orthogonally to the channel wells. For example, in some embodiment, a vertical well is etched at every intersection formed by the two-dimensional grid pattern. In other embodiments, vertical wells may be selectively placed only at some intersections, or may be placed at non-intersecting points along trace lines. The arrangement of vertical wells is selected to impart the desired metamaterial property.

In some embodiments, where a complete wire mesh is desired, vertical wells 220 may be etched at every intersection, and each vertical well will pass through each layer, so that a network of vertical wells joins every intersection of each layer to the corresponding intersections of each other layer. In other embodiments, a plurality of vertical wells are provided, at least some of which will pass through more than one layer, so that individual wells join two or more layers to one another. The result is a three-dimensional network containing a plurality of substantially identical channel grids joined to one another by a plurality of vertical wells, called herein a 3-D cavity mesh.

In step 444, the 3-D cavity mesh is filled with a material. This step may include, for example, deposition of a metal along the walls of each channel so that a network of hollow "tubes" is formed. In other embodiments, the 3-D channel mesh may be completely filled with metal, resulting in a solid wire mesh metamaterial such as self-aligned metamaterial 300. This exemplary metamaterial is composed entirely of one substance, and metamaterial properties are affected by the substance itself as well as the final arrangement of the mesh.

The filling step may involve exposing vertical edges of the channel grid so that they can be metallized. The horizontal grid pattern may include vertical intersections. In certain embodiments, metallization in may be replaced with another desired deposition process and type of material.

In step 450, the substrate 200 is removed from around metamaterial 300 only if it is desirable or beneficial to do so. For example, if metamaterial 300 is a wire mesh to be used as an antenna at infrared frequencies, it may be beneficial to leave substrate 200 in place. However, in antennas at other frequencies, it may be beneficial or necessary to chemically remove substrate 200. In step 454, metamaterial 300 may optionally be encased for example in a resin. The desirability of encasing in resin will depend on the metamaterial and the desired properties. In some embodiments, encasing metamaterial 300 in resin may defeat some or all of the desired metamaterial properties.

Similar methods may be used to make mixed-material metamaterials. For example, the process as described above may be suitable for making a metamaterial antenna. The process can be modified slightly to make a metamaterial filter for example by making metamaterial 300 in three separate blocks, two of which are made of conductive metal and one of which is made of a dielectric. By joining three separate blocks in the pattern conductor-dielectric-conductor, a high-frequency passband can be produced and used to filter unwanted frequencies.

Returning to the step-460 branch of FIG. 4, at step 460, the two-dimensional channel grids are filled with a first material. This may be done in the same manner as described in step 444.

In step 464, vertical wells are etched. This method is similar as to that described in step 440. In step 464, selection of an appropriate etchant and process is necessary because an existing wire mesh is already in place. For example, if a chlorinated chemical process is used, the existing wire pieces may vertically block the etch, so that "walls" of substrate material are left between layers of wire mesh. To avoid formation of walls, a fluorinated chemical etch process may be used instead to ensure a clean etch around each individual wire and between wires. The result is a line of exposed wire intersections running down the well.

In step 470, a second material may deposited on exposed intersections. For example, if the wire mesh is made of aluminum, a gold beat may be deposited on each exposed junction. This can be accomplished for example by electrically or chemically "growing" the beads on the junctions according to methods known in the art.

In step 474, after beads of the second material are deposited or "grown" on the exposed junctions, the remainder of each well may be filled with a desired fill material, such as resin. Those with skill in the art will recognize that other combinations are possible to select for desired metamaterial properties. For example, vertical wells may be filled with the first material after beads of the second material are deposited on the junctions.

In step 480, once the vertical wells are filled in, the wire mesh has sufficient three-dimensional structure that substrate 200 can be removed. The result is a wire mesh similar to metamaterial 300, with a plurality of beads of a second material deposited on intersections throughout, and vertical structure provided by a third material such as resin.

In step 484, the new wire mesh may be encased in a material such as resin, which may be the same resin as the resin of the third material in step 474. The resin encasing provides mechanical structure.

In step 490, the first material of step 460 is removed. For example, in an exemplary embodiment, the first material is aluminum, the second material is gold, and the third material is resin. Thus, before step 490, a wire mesh of aluminum is encased within a resin body. At each intersection in the wire mesh there is a gold bead. In step 490, terminal ends of the aluminum wires may be exposed to a reactive chemical such as nitric acid, fluoric acid, or an aluminum etchant. In this case, it is important to select a second material that is not reactive with or is less reactive with the chemical agent, such as gold. The chemical agent dissolves the aluminum wire mesh, but does not destroy the gold beads. Any spaces left by the dissolved aluminum may then be back-filled with additional resin.

The result of step 490 is an artificial resin crystal having a plurality of gold beads dispersed throughout the resin in a pattern selected for a desired metamaterial property. For example, the gold beads may impart a desired resonant frequency.

Although a series of steps have been disclosed in FIG. 4 in an exemplary order, those with skill in the art will recognize that the order of some steps may be varied, and that some steps may be optional to certain embodiments. For example, a first exemplary process may include, in order, steps 410→420→430→440→444 and optionally either or both of 450 and 454. The result of this exemplary method is a uniform wire mesh that is optionally left inside the substrate or optionally encased in a polymer resin or other casing material.

Figure 5:
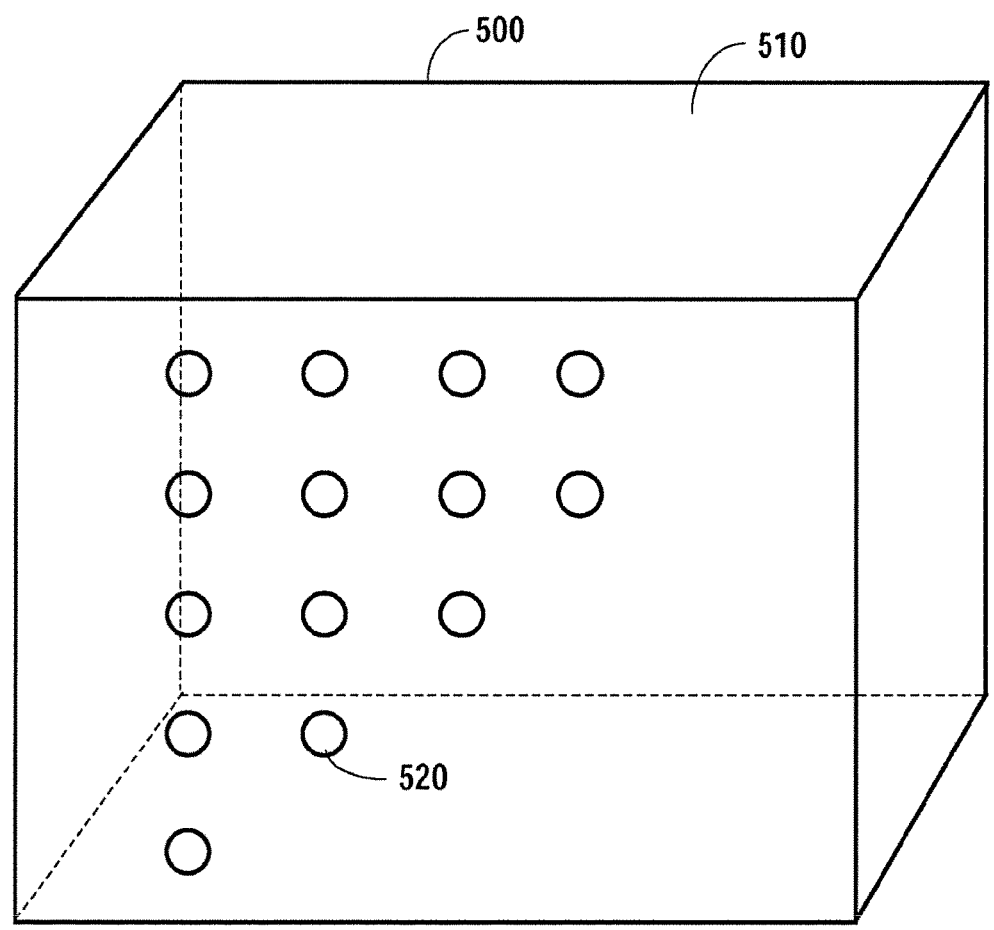
FIG. 5 is a perspective view of an artificial nanocrystal.

A second exemplary process may include, in order, steps 410→420→430→460→464→470→474 and optionally steps 480, 484, and 490. The result of this process may be an exemplary artificial nanocrystal (FIG. 5).

A third exemplary process may include, in order, steps 410→420→430→460→464→474 and optionally step 480 and 484. The result of this process is a three-dimensional mesh wherein the each mesh grid is upheld by a material different from the grid material, for example a wire mesh with structural resin providing vertical support between layers.

A fourth exemplary process includes following the method of FIG. 4, but etching the substrate deep enough to form one or more two-dimensional wire meshes after the annealing and metalizing operations. In this example, steps 440 and 464 (etching vertical wells) are unnecessary. The wire meshes may remain buried in the substrate or may be exposed to the surface of the. This process is useful for buried in-plane propagation, for example in electro-optical circuits, and also may be used as a method of creating integrated or printed circuits. In this exemplary embodiment, the substrate remains substantially in place. Advantageously, wires thus formed will have circular cross sections rather than rectangular cross sections, which may impart desired properties including isotropy in a wave's behavior. Furthermore, in an exemplary electro-optical circuit, a wire mesh could be used in optical transmission lines to affect the propagation phase. This is important when using nanoantennas to transmit optical signals because such antennas, when arrayed, must be fed with the correct phase by transmission lines to achieve the desired radiation pattern. In electro-optical circuits (or any on-chip circuits), space is at a premium. The ability to array antennas in whatever space and direction is available, limited only by the desired pattern, is therefore helpful.

A fifth exemplary process includes etching and annealing vertical wells without constructing the grid pattern. In this case, a plurality of wells may be etched in a desired pattern, and the wells then annealed, so that a three-dimensional matrix of bubbles is formed in the substrate. The bubbles may be useful in tuning permittivity or spatial indexing. They can also create broadband negative refraction materials. In some cases, creation of a bubble matrix may be combined with other exemplary methods to further select a desired metamaterial property.

FIG. 5 is a perspective view of an exemplary artificial nanocrystal 500 manufactured according to the process of FIG. 4. Nanocrystal 500 is formed with a structural body of resin 510, and has placed therein a plurality of beads 520. The beads may be placed for example in an ordered or periodic pattern selected for a particular resonance. In some embodiments, an artificial nanocrystal 500 will have a much sharper resonance curve than a natural crystal. If nanocrystal 500 is an electromagnetic of photonics crystal, the useful frequencies will be set by the wavelengths equivalent to repeated unit cell size. Electromagnetic or photonics crystals are often used to create a bandgap so that radiation at a selected frequency will not propagate. Defects may also be introduced throughout the material, for example by chemical etching additional vertical wells, which may serve as "light tunnels."

The novel and patentably distinct methods of producing metamaterials described herein may also be used for producing other complex electromagnetic media, such as photonic crystals and/or electromagnetic crystals. The methods described herein may be applicable to produce materials having repeated structural dimensions that are smaller than and/or about the same size as an operational wavelength of radiation. Other applications include electromagnetic filters configured to block specific wavelengths of radiation; for example, a filter could be configured to block wavelengths in common communication-band frequencies but pass visible light.

While the subject of this specification has been described in connection with one or more exemplary embodiments, it is not intended to limit the claims to the particular forms set forth. On the contrary, the appended claims are intended to cover such alternatives, modifications and equivalents as may be included within their spirit and scope.

What is claimed is:

1. A method of manufacturing a metamaterial comprising:
    etching a two-dimensional horizontal grid pattern into a substantially homogeneous substrate block, the two-dimensional grid pattern and depth of the etch being selected for a desired metamaterial property;
    annealing the substrate to form a plurality of nano-scale channel grids, each channel grid being characterized by the two-dimensional grid pattern and each channel grid being substantially identical to and vertically aligned with each other channel grid; and
    depositing a first material in the channel grids to form multiple layers of wire mesh in the substrate block.

2. The method of claim 1, further comprising etching a plurality of vertical wells in the substrate block, each vertical well substantially orthogonally intersecting at least two channel grids.

3. The method of claim 2, further comprising depositing the first material in the vertical wells.

4. The method of claim 2, further comprising depositing a second material in the vertical wells.

5. The method of claim 2, further comprising:
    depositing a conductive metal bead on each exposed intersection;
    filling the vertical wells with a rigid structural medium; and
    chemically removing the two-dimensional wire grids.

6. The method of claim 5, further comprising:
    chemically removing the substrate block to leave a three-dimensional mesh structure;
    encasing the three-dimensional mesh structure in the rigid structural medium.

7. The method of claim 5, further comprising filling voids left by removal of the wire grid with a rigid structural medium.

8. The method of claim 2, further comprising removing the substrate block.

9. The method of claim 2, wherein the operation of depositing a first material in the channel grids precedes the step of etching a plurality of vertical wells and further comprising:

depositing a second material on a plurality of intersecting lines of the first material exposed by the vertical wells;
depositing a third material in the vertical wells;
removing the substrate block;
encasing the multi-layer wire mesh in a rigid medium;
removing the first material; and
back-filling voids in the rigid medium left by the removal of the first material.

10. The method of claim 9, wherein depositing the second material comprises electrochemical deposition.

11. The method of claim 9, wherein the first material and the third material are the same.

12. The method of claim 9, wherein the first material is aluminum and the second material is gold.

13. The method of claim 9, wherein etching the vertical wells comprises etching with a fluorechemical process.

14. The method of claim 2, wherein the vertical channels do not intersect grid patterns.

15. The method of claim 2, wherein materials deposited in the channels and the vertical wells are comprised of layers of different constituent materials.

16. The method of claim 1, wherein depositing the first material comprises depositing a metal on the edges of the channels whereby hollow metallic tubes are formed.

17. The method of claim 1, wherein depositing the first material comprises depositing a material or layers of material on the edges of the channels whereby hollow tubes are formed.

18. The method of claim 1, wherein depositing the first material comprises filling the channels with the first material whereby solid wires are formed.

19. The method of claim 1, wherein the grid pattern is non-rectilinear.

20. The method of claim 1, wherein the grid pattern is a set of parallel lines.

21. The method of claim 1, wherein vertical etch profiles have tapered walls, resulting in non-identical 2D mesh structures.

* * * * *